(12) United States Patent
Joubert et al.

(10) Patent No.: US 8,546,263 B2
(45) Date of Patent: Oct. 1, 2013

(54) METHOD OF PATTERNING OF MAGNETIC TUNNEL JUNCTIONS

(75) Inventors: Olivier Joubert, Meylan (FR); Benjamin Schwarz, San Jose, CA (US); Jérémy Gilbert Maurice Pereira, Grenoble (FR); Kevin Menguelti, Grenoble (FR); Erwine Maude Pargon, Claix (FR); Maxime Darnon, Grenoble (FR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/095,736

(22) Filed: Apr. 27, 2011

(65) Prior Publication Data

US 2012/0276657 A1 Nov. 1, 2012

(51) Int. Cl.
*H01L 21/302* (2006.01)

(52) U.S. Cl.
USPC ............... 438/706; 438/3; 257/E21.665

(58) Field of Classification Search
USPC .................... 438/3, 706, 712, 720
See application file for complete search history.

(56) References Cited

U.S. PATENT DOCUMENTS

| | | | |
|---|---|---|---|
| 6,759,263 B2 | 7/2004 | Ying et al. | |
| 6,821,907 B2 | 11/2004 | Hwang et al. | |
| 6,893,893 B2 | 5/2005 | Nallan et al. | |
| 6,911,346 B2 * | 6/2005 | Ying et al. | 438/3 |
| 6,943,039 B2 | 9/2005 | Ying et al. | |
| 6,964,928 B2 | 11/2005 | Ying et al. | |
| 6,984,585 B2 | 1/2006 | Ying et al. | |
| 7,105,361 B2 | 9/2006 | Chen et al. | |
| 7,320,942 B2 | 1/2008 | Chen et al. | |
| 7,645,618 B2 * | 1/2010 | Ditizio | 438/3 |
| 2002/0076837 A1 | 6/2002 | Hujanen et al. | |
| 2003/0219912 A1 | 11/2003 | Chen et al. | |
| 2003/0219984 A1 | 11/2003 | Ying et al. | |
| 2004/0043610 A1 | 3/2004 | Yates | |
| 2004/0106271 A1 | 6/2004 | Li et al. | |
| 2004/0137749 A1 | 7/2004 | Ying et al. | |
| 2006/0019487 A1 | 1/2006 | Leuschner et al. | |
| 2007/0119811 A1 * | 5/2007 | Nakatani et al. | 216/22 |
| 2009/0223812 A1 * | 9/2009 | Yakshin et al. | 204/192.15 |
| 2010/0003828 A1 | 1/2010 | Ding et al. | |
| 2011/0111532 A1 * | 5/2011 | Ryu et al. | 438/3 |

* cited by examiner

*Primary Examiner* — Charles Garber
*Assistant Examiner* — Reema Patel
(74) *Attorney, Agent, or Firm* — Patterson & Sheridan, LLP

(57) ABSTRACT

Embodiments of the invention generally relate to methods for fabricating devices on semiconductor substrates. More specifically, embodiments of the invention relate to methods of patterning magnetic materials. Certain embodiments described herein use a reducing chemistry containing a hydrogen gas or hydrogen containing gas with an optional dilution gas at temperatures ranging from 20 to 300 degrees Celsius at a substrate bias less than 1,000 DC voltage to reduce the amount of sputtering and redeposition. Exemplary hydrogen containing gases which may be used with the embodiments described herein include $NH_3$, $H_2$, $CH_4$, $C_2H_4$, $SiH_4$, and $H_2S$. It has been found that patterning a magnetic tunnel junction with an oxidizer-free gas mixture comprising hydrogen maintains the integrity of the magnetic tunnel junction without producing harmful conductive residue.

16 Claims, 5 Drawing Sheets

METHOD OF PATTERNING OF MAGNETIC TUNNEL JUNCTIONS

BACKGROUND

1. Field

Embodiments described herein generally relate to methods for fabricating devices on semiconductor substrates. More specifically, embodiments described herein relate to methods of patterning magnetic materials.

2. Description of the Related Art

Microelectronic devices are generally fabricated on a semiconductor substrate as integrated circuits wherein various conductive layers are interconnected to one another to facilitate propagation of electronic signals within the device. An example of such a device is a storage element in magneto-resistive random access memories (MRAM) that facilitate storage of digital information in a form of the direction of magnetization of a magnetic material within the MRAM.

A memory cell in an MRAM device generally is a multi-layered structure comprising a pair of magnetic layers separated by a tunnel layer. More specifically, the MRAM device comprises a free (or top) magnetic layer that may change a direction of magnetization and a bottom magnetic layer that has a fixed direction of magnetization. The magnetic layers are separated by the tunnel layer formed of a non-magnetic dielectric material, such as aluminum oxide ($Al_2O_3$), magnesium oxide (MgO), or other similar dielectric materials. The top and bottom magnetic layers may each comprise a plurality of sub-layers of magnetic materials, e.g., permalloy (NiFe), cobalt iron (CoFe), and the like. The top and bottom magnetic layers are also supplied with film electrodes (e.g., comprising tungsten (W), tantalum (Ta), tantalum nitride (TiN), copper (Cu), and the like) to form an electrical connection for the memory cell to the lines of the MRAM.

Fabrication of an MRAM device comprises etch processes in which one or more layers comprising an MRAM film stack are removed, either partially or in total. The MRAM device comprises the layers that are generally formed from materials that may be easily oxidized, sensitive to corrosion or very thin, as well as may leave difficult to remove metal-containing post-etch residues upon the film stack. Such residues may build up along the sides of the film stack. The conductive residues or eroded layers may cause electrical short-circuits within an MRAM device, e.g., between the top and bottom magnetic layers, or may render the MRAM device to operate sub-optimally or not at all.

Various post-etching cleaning methods including wet cleaning processes have been developed for removing conductive residues. During one exemplary wet cleaning process the conductive residues are removed by repeatedly exposing the substrate to cleaning solvents comprising, in various combinations, hydrogen fluoride (HF), ammonium fluoride ($NH_4F$), ammonium hydroxide ($NH_4OH$), hydrogen peroxide ($H_2O_2$), and the like. Disadvantages of using the wet cleaning processes to remove residues produced during fabrication of the MRAM devices include an increase reduced productivity of the overall etching process due to the addition of the wet cleaning process, lack of real time end point detection, as well as a need in dedicated processing equipment.

Other post-etching cleaning methods include the use of sulfur based chemistries to sputter away the conductive residues. However, current sulfur based chemistries have been found to adversely affect the tunnel junction layer.

Therefore, there is a need in the art for improved methods for fabricating an MRAM device while reducing the amount of conductive residue produced.

SUMMARY

Embodiments described herein generally relate to methods for fabricating devices on semiconductor substrates. More specifically, embodiments described herein relate to methods of patterning magnetic materials. The methods may include one or more of the following aspects:

providing a substrate having one or more layers of magnetic material deposited thereon;

forming a patterned mask on the one or more layers of magnetic material;

etching the one or more layers of magnetic material using an oxidizer-free gas mixture comprising a hydrogen containing gas to remove at least a portion of the one or more layers of magnetic material;

wherein the oxidizer-free gas mixture is a halogen-free gas mixture;

wherein the hydrogen containing gas is selected from the group consisting of: ammonia ($NH_3$), hydrogen ($H_2$), methane ($CH_4$), acetylene ($C_2H_4$), silane ($SiH_4$), hydrogen sulfide ($H_2S$), and combinations thereof;

wherein the oxidizer-free gas mixture further comprises a dilution gas;

wherein the dilution gas is selected from the group consisting of: helium (He), xenon (Xe), argon (Ar), nitrogen ($N_2$), and combinations thereof;

wherein the magnetic material is selected from at least one of CoFe, NiFe, MgO, $Al_2O_3$, Ru, IrMn, and PtMn;

wherein the one or more layers of magnetic material is part of a magneto-resistive random access memory (MRAM) stack;

wherein a temperature of the one or more layers of magnetic material is from about 20 degrees Celsius to about 300 degrees Celsius during the etching the one or more layers of magnetic material;

wherein the temperature is from about 200 degrees Celsius to about 250 degrees Celsius;

wherein a bias of less than 1,000 DC volts is applied to the one or more layers of magnetic material during the etching the one or more layers of magnetic material; and energizing the oxidizer-free gas mixture to a plasma;

In another embodiment a method of fabricating a magneto-resistive random access memory (MRAM) device from a film stack comprising a top electrode layer, a free magnetic layer, a tunnel layer, a magnetic film stack, a bottom electrode layer, and a barrier layer formed on a semiconductor substrate is provided. The methods may include one or more of the following aspects:

forming a first patterned mask on the film stack to define the device;

etching the top electrode layer;

forming a second patterned mask on free magnetic layer and the film stack to define the device;

etching the magnetic film stack using an oxidizer-free gas mixture comprising a hydrogen containing gas to remove at least a portion of the magnetic film stack;

wherein the oxidizer-free gas mixture is a halogen-free gas mixture;

wherein the hydrogen containing gas is selected from the group consisting of: ammonia ($NH_3$), hydrogen ($H_2$), methane ($CH_4$), acetylene ($C_2H_4$), silane ($SiH_4$), hydrogen sulfide ($H_2S$), and combinations thereof;

wherein the oxidizer-free gas mixture further comprises a dilution gas;

wherein the dilution gas is selected from the group consisting of: helium (He), xenon (Xe), argon (Ar), nitrogen ($N_2$), and combinations thereof;

energizing the oxidizer-free gas mixture to a plasma;
wherein the top electrode comprises at least one of tungsten (W), titanium nitride (TiN), titanium (Ti), tantalum (Ta), and tantalum nitride (TaN);
the free magnetic layer comprises at least one of CoFe and NiFe;
the tunnel layer comprises at least one of $Al_2O_3$ and MgO;
the magnetic film stack comprises at least one of NiFe, Ru, CoFe, PtMn, and IrMn;
the bottom electrode comprises at least one of tungsten (W), titanium nitride (TiN), titanium (Ti), tantalum (Ta), and tantalum nitride (TaN);
the barrier layer comprises at least one of $SiO_2$ and $Si_3N_4$;
wherein a temperature of the magnetic film stack is from about 20 degrees Celsius to about 300 degrees Celsius during the etching the magnetic film stack;
wherein the temperature is from about 200 degrees Celsius to about 250 degrees Celsius; and
wherein a bias of less than 1,000 DC volts is applied to the magnetic film stack during the etching the magnetic film stack.

BRIEF DESCRIPTION OF THE DRAWINGS

So that the manner in which the above-recited features of the embodiments described herein can be understood in detail, a more particular description of the embodiments described herein, briefly summarized above, may be had by reference to embodiments, some of which are illustrated in the appended drawings. It is to be noted, however, that the appended drawings illustrate only typical embodiments of the embodiments described herein and are therefore not to be considered limiting of its scope, for the embodiments described herein may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
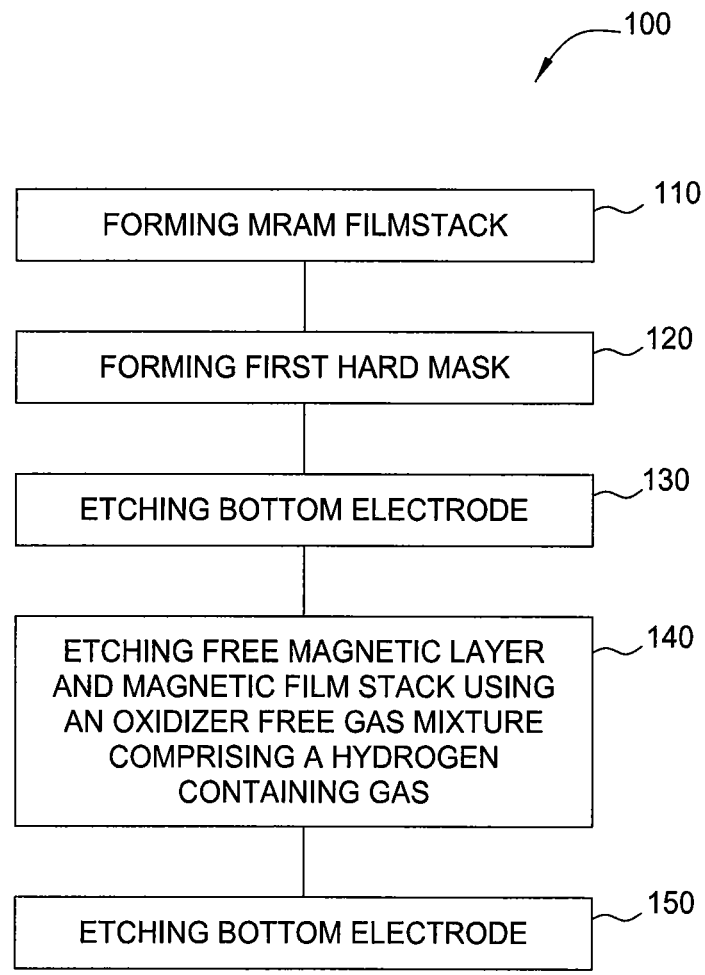
FIG. 1 depicts a flow diagram of one embodiment of a method of fabricating an MRAM film stack in accordance with embodiments described herein.

Embodiments described herein generally relate to methods for patterning a magnetic stack (e.g., a magnetic tunnel junction (MTJ)) by exposing the magnetic stack to an oxidizer-free gas mixture comprising a hydrogen containing gas to remove at least a portion of the magnetic stack.

MTJ stacks comprise multilayer stacks of difficult to etch materials such as nickel iron (NiFe), cobalt iron (CoFe), ruthenium (Ru), platinum manganese (PtMn), tantalum (Ta) and a very sensitive tunneling layer, typically magnesium oxide (MgO) or aluminum oxide ($Al_2O_3$). It is critical for MTJ device performance that no metallic residues shorten across the tunneling layer and that the tunneling layer is not attacked. Traditional MTJ stacks are etched in an ion-mill or plasma etch reactor using either Ar ions, halogens to form metal halogen compounds or chemistries such as $CO/NH_3$ or $CH_3OH$ with the goal of forming volatile carbonyl components. These chemistries have met with limited success due to the limited volatility of products even in a plasma environment. These chemistries may lead to redeposition during these etch steps and attack of the magnetic tunneling layer (e.g., oxidation, delamination, halogen diffusion, and corrosion). Resulting structures suffer either from large sidewall angle (e.g., less than 85 degrees) or shorting over the tunnel structure. Additional problems arise when using an oxygen source such that the tunneling layer integrity can be compromised due to additional oxidation and due to oxidation of the neighboring magnetic layers.

Certain embodiments described herein use a reducing chemistry containing a hydrogen gas or hydrogen containing gas with an optional dilution gas at temperatures ranging from 20 to 300 degrees Celsius at a substrate bias less than 1,000 DC voltage to reduce the amount of sputtering and redeposition. Exemplary hydrogen containing gases which may be used with the embodiments described herein include $NH_3$, $H_2$, $CH_4$, $C_2H_4$, $SiH_4$, and $H_2S$. Exemplary dilution gases which may be used with the embodiments described herein include He, Xe, Ar, $N_2$, and combinations thereof. It is believed that hydrogen helps to form volatile products from etched components. Not to be bound by theory, but it is also believed that the hydrogen reduces the surface bonding of the top monolayer and allows easier desorption of difficult to volatize materials. It has been found that patterning a magnetic tunnel junction with an oxidizer-free gas mixture comprising hydrogen maintains the integrity of the magnetic tunnel junction without producing harmful conductive residue.

Exemplary etch reactors that are suitable for practicing the embodiments described herein include Decoupled Plasma Source (DPS), DPS-II, DPS-II AdvantEdge HT, DPS Plus, or DPS DT, HART, a HART TS etch reactor, all available from Applied Materials, Inc., of Santa Clara, Calif. It is contemplated that the etching processes described herein may be performed in other etch reactors, including those from other manufacturers.

In one application, the method is used to pattern a magneto-resistive random access memory (MRAM) device. Other exemplary processes in which the methods described herein may be used include patterning magnetic recording heads, platinum etching materials like Ni, Co, Fe, and combinations thereof, and metal gate applications.

FIG. 1 depicts a flow diagram of a method 100 of fabricating an MRAM device in accordance with the embodiments described herein. The method 100 comprises processes that are performed upon an MRAM film stack during fabrication of the MRAM device.

FIGS. 2A-2F depict a sequence of schematic, cross-sectional views of a substrate having an MRAM film stack being formed in accordance with the method of FIG. 1. The views in FIGS. 2A-2F relate to individual processing steps that are used to form the MRAM device. Sub-processes, such as lithographic processes (e.g., exposure and development of photoresist, and the like) are well known in the art and, as such, are not shown in FIG. 1 and FIGS. 2A-2F.

Figure 2A:
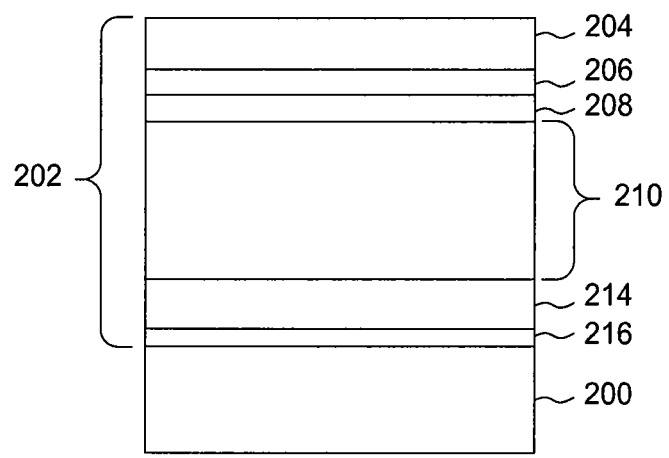
FIGS. 2A-2F depict a sequence of schematic, cross-sectional views of a substrate having an MRAM film stack being formed in accordance with one embodiment of the method of FIG. 1.

At block 110 a MRAM film stack 202 is formed on a substrate 200 (FIG. 2A). In one embodiment, the MRAM film stack 202 comprises, from top down to the substrate 200, a top electrode layer 204, a free magnetic layer 206, a tunnel layer 208, a multi-layer magnetic film stack 210, a bottom electrode layer 214, and a barrier layer 216.

In one exemplary embodiment, the top electrode layer 204 and bottom electrode layer 214 are formed from materials, such as tungsten (W), tantalum (Ta), tantalum nitride (TaN), titanium nitride (TiN), titanium (Ti), ruthenium (Ru), combinations thereof and the like, to a thickness of about 200-600 Angstroms. The free magnetic layer 206 generally comprises nickel and cobalt iron alloys, e.g., CoFe, NiFe, CoFeB, and the like. The free magnetic layer 206 may consist of one or more films of such alloys formed to a total thickness of about 10-200 Angstroms. The tunnel layer 208 may be formed, e.g., from alumina ($Al_2O_3$), magnesium oxide (MgO), or similar materials having dielectric properties to a thickness of about 10-20 Angstroms. The tunnel layer 208 is sandwiched between the free magnetic layer 206 and magnetic film stack 210 to form a magnetic tunnel junction of the MRAM device being fabricated. The magnetic film stack 210 generally is a multi-layer film stack comprising, e.g., layers of CoFe, Ru, PtMn or IrMn, NiFe, NiFeCr, and combinations thereof. The barrier layer 216 generally is a dielectric layer (e.g., layer of silicon dioxide ($SiO_2$), silicon nitride ($Si_3N_4$), and the like). It should be understood, however, that the MRAM film stack 202 may comprise layers that are formed from other materials or to a different thickness.

The layers comprising the MRAM film stack 202 may be deposited using a vacuum deposition technique, such as an atomic layer deposition (ALD), a physical vapor deposition (PVD), chemical vapor deposition (CVD), plasma enhanced CVD, and the like. Fabrication of the MRAM devices may be performed using, e.g., the respective processing reactors of the CENTURA® platform, ENDURA® platform, and other semiconductor substrate processing systems available from Applied Materials, Inc. of Santa Clara, Calif. and others.

Figure 2B:
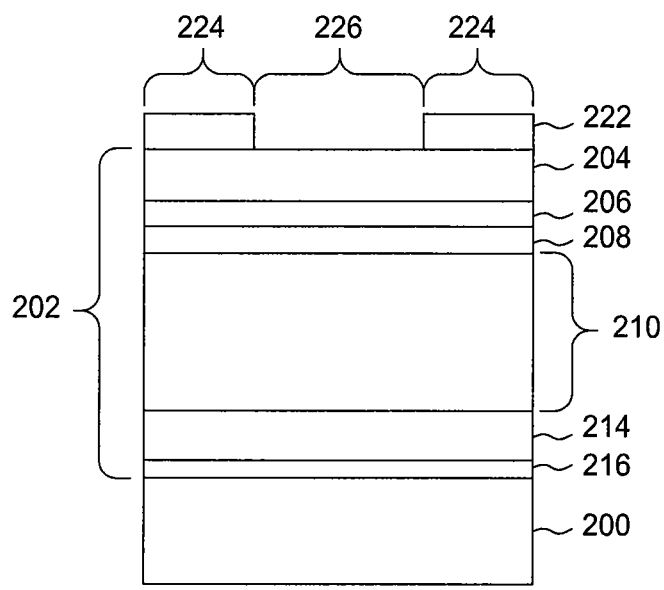

At block 120, a mask 222 is formed on the top electrode layer 204 (FIG. 2B). The mask 222 defines location and topographic dimensions of the MRAM device being fabricated using the method 100. In one embodiment, the mask 222 protects regions 224 of the MRAM film stack 202 while exposing the adjacent regions 226 of the film stack. The mask 222 generally is a patterned hard mask formed from a material that is resistant to chemistries used to etch the top electrode layer 204 and free magnetic layer 206 (discussed in reference to blocks 130 and 140 below), as well as stable at the temperatures used during such etch processes.

The mask materials may include, e.g., silicon dioxide ($SiO_2$), inorganic amorphous carbon (i.e., α-carbon), high-k dielectric materials (e.g., hafnium dioxide ($HfO_2$), $HfSiO_2$, and the like), and the like. Alternatively, the mask 222 may be formed from a photoresist. In one illustrative embodiment, the mask 222 is formed from silicon dioxide to a thickness of about 300 to 2,000 Angstroms.

Figure 2C:
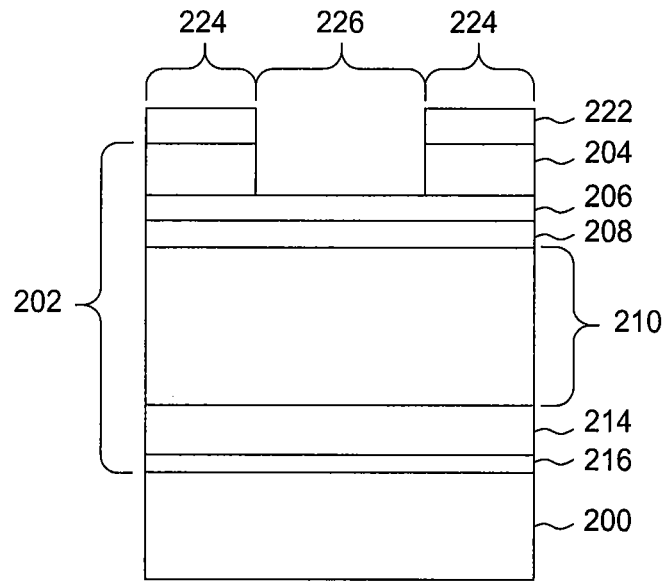

At block 130, the top electrode layer 204 is plasma etched and removed in the region 226 (See FIG. 2C). The top electrode layer 204 may be etched using a fluorine-based chemistry (e.g., comprising carbon tetrafluoride ($CF_4$), trifluoromethane ($CHF_3$), and the like) or a chlorine-based chemistry (e.g., comprising chlorine ($Cl_2$), hydrogen chloride (HCl), and the like), as well as a diluent gas, such as argon (Ar). The mask 222 (e.g., $SiO_2$ mask) is used as an etch mask and the free magnetic layer 206 may be used as an etch stop layer (e.g., an endpoint detection system of the etch reactor may monitor plasma emissions at a particular wavelength to determine that the top electrode layer 204 has been removed in the region 226).

Block 130 may be performed in a Decoupled Plasma Source (DPS I) of the CENTURA® system. The DPS I reactor uses an inductive source to produce a high-density plasma and a source of RF power to bias the substrate.

In one exemplary embodiment, the top electrode layer 204 is etched by providing carbon tetrafluoride at a rate of 40 to 80 sccm and trifluoromethane at a rate of 10 to 30 sccm (i.e., a $CF_4$:$CHF_3$ flow ratio ranging from 4:3 to 8:1), as well as argon at a rate of 40 to 80 sccm, applying 200 to 3,000 W of plasma power and 0 to 300 W of bias power, and maintaining a substrate temperature at 0 to 250 degrees Celsius and a pressure in the reaction chamber at 5 to 40 mTorr. One exemplary process provides $CF_4$ at a rate of 60 sccm, $CHF_3$ at a rate of 20 sccm (i.e., a $CF_4$:$CHF_3$ flow ratio of about 3:1), Ar at a rate of 60 sccm, 1,000 W of plasma power, 50 W of bias power, a substrate temperature of 80 degrees Celsius, and a pressure of 10 mTorr.

Figure 2D:
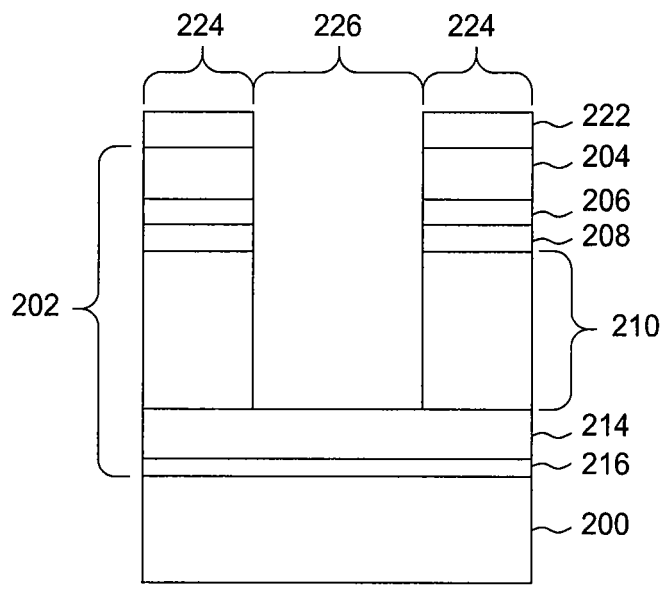
Figure 2E:
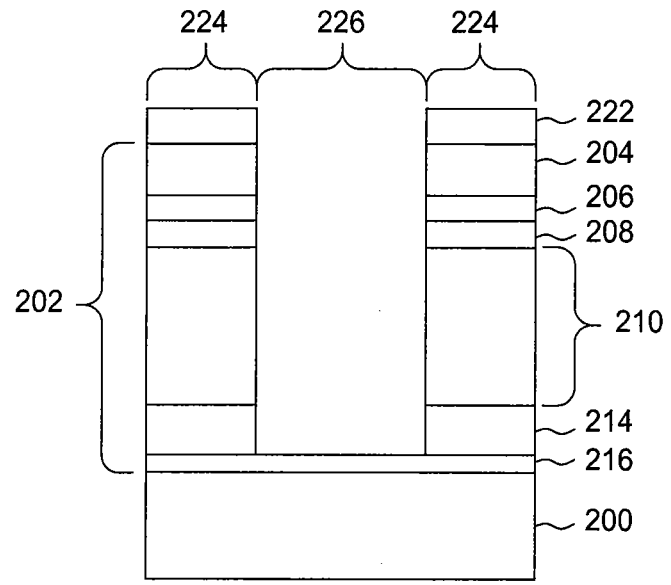
Figure 2F:
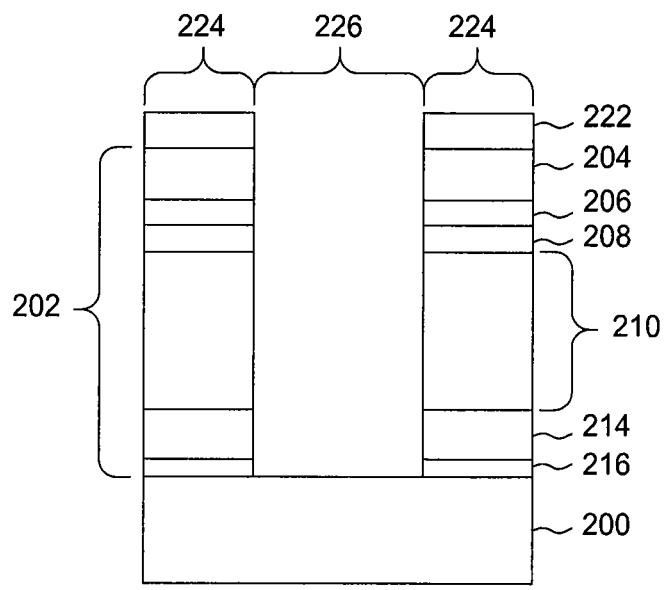

At block 140, at least one of the free magnetic layer 206, the tunnel junction layer 208, and the magnetic film stack 210 may be etched using an oxidizer-free gas mixture comprising a hydrogen containing gas (FIG. 2D). The hydrogen containing gas mixture may be selected from the group consisting of $NH_3$, $H_2$, $CH_4$, $C_2H_4$, $SiH_4$, $H_2S$, and combinations thereof. The oxidizer-free gas mixture may be a halogen-free gas mixture. The oxidizer-free gas mixture may further comprise a diluent gas. The diluent gas may be selected from the group consisting of helium (He), xenon (Xe), argon (Ar), nitrogen ($N_2$), and combinations thereof. The substrate temperature may be maintained at a temperature between about 20 to 300 degrees Celsius. In one embodiment, the substrate temperature may be maintained at a temperature between about 200 to 350 degrees Celsius. The substrate may be biased at a low substrate bias less than 1,000 DC voltage. The oxidizer-free gas mixture may be energized to form a plasma. The chamber pressure may be between 1 to 50 mTorr. In one embodiment, the chamber pressure may be less than 20 mTorr, for example, between 1 and 20 mTorr. In one embodiment, the chamber pressure may be less than 10 mTorr, for example, between 1 to 10 mTorr.

In one exemplary embodiment, the oxidizer-free hydrogen containing gas is provided at a rate of 5 to 1,000 sccm, more preferentially at a rate of 50 to 200 sccm, argon is provided at a rate of 0 to 1,000 sccm, 200 to 3,000 W of plasma power and 0 to 1,000 W of bias power is provided, and a substrate temperature at 20 to 300 degrees Celsius and a pressure in the reaction chamber at 1 to 20 mTorr is maintained. One exemplary process provides $NH_3$ at a rate of 90 sccm, 400 W of plasma power, 300 W of bias power, a substrate temperature of 250 degrees Celsius and a pressure of 10 mTorr.

At block 150, the bottom electrode 214 is etched (FIG. 2H) and removed in the region 226. In one embodiment, the bottom electrode 214 is etched using the same etching chemistry as block 140. In one embodiment, the bottom electrode 214 is etched using the same etching chemistry as the top electrode layer 204. The barrier layer 216 (e.g., $SiO_2$, silicon nitride ($Si_3N_4$), and the like) may be used as an etch stop layer. In another embodiment, the bottom electrode 214 is plasma etched and removed in the regions 226 using, e.g., a chlorine-based chemistry. In one illustrative embodiment, chlorine is provided at a rate of 10 to 100 sccm and argon at a rate of 10 to 100 sccm (i.e., a $Cl_2$:Ar flow ratio ranging from 1:10 to 10:1), 200 to 3,000 W of plasma power and 0 to 300 W of bias power is applied, and a substrate temperature at 15 to 80 degrees Celsius and a pressure in the reaction chamber at 5 to 40 mTorr is maintained. One exemplary etch process provides $Cl_2$ at a rate of 45 sccm, Ar at a rate of 45 sccm (i.e., a $Cl_2$:Ar flow ratio of about 1:1), 700 W of plasma power, 75 W of bias power, a substrate temperature of 80 degrees Celsius, and a pressure of 10 mTorr.

The MRAM device operates by applying a voltage across the electrodes 204 and 214 to set the direction of the magnetic moments in the free magnetic layer 206. The layer of PtMn or IrMn is a "pinning" layer that sets (or pins) the direction of the magnetic moments of the magnetic film stack 210 (the "pinned" layer). Depending on whether the direction of moments in the free magnetic layer 206 is aligned with the direction of the pinned layer 210 or is opposed to the direction of the magnetic moments in the pinned layer 210, the electrical current through the MRAM device is either high or low. The establishment of the moment direction in the free magnetic layer 206 is used to store information in an MRAM cell. A plurality of the cells can be arranged to form a MRAM memory array.

Figure 3:
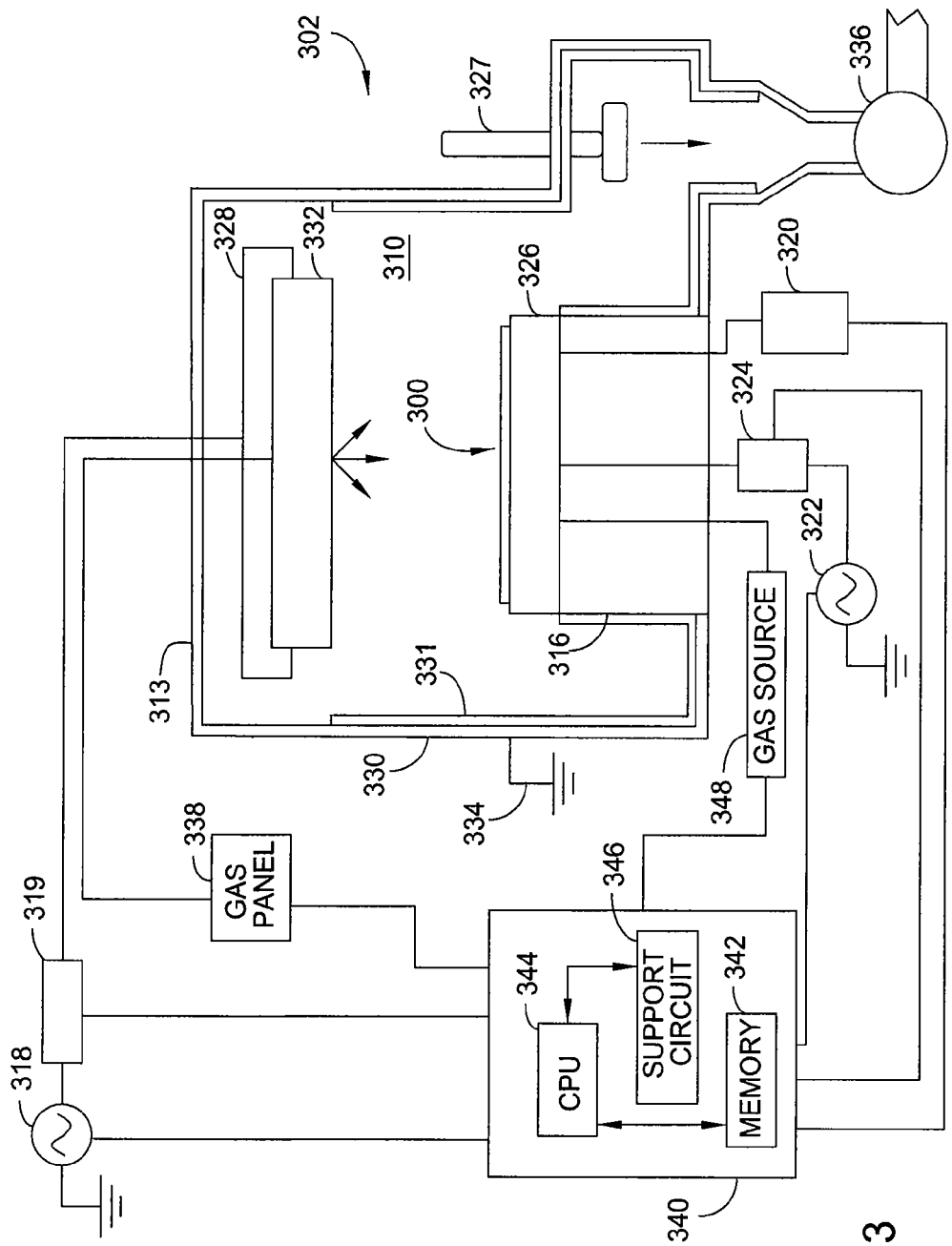
FIG. 3 depicts a schematic cross-sectional view of a plasma reactor used according to embodiments described herein.

FIG. 3 depicts a schematic, cross-sectional view of one embodiment of a plasma reactor used according to embodiments described herein. FIG. 3 depicts a schematic, cross-sectional diagram of one embodiment of a plasma source etch reactor 302 suitable for performing the metal layer etch according to the embodiments described herein. Exemplary etch reactors that are suitable for practicing the embodiments described herein include Decoupled Plasma Source (DPS), DPS-II, DPS-II AdvantEdge HT, DPS Plus, or DPS DT, HART, a HART TS etch reactors, all available from Applied Materials, Inc., of Santa Clara, Calif. It is contemplated that the etching process described herein may be performed in other etch reactors, including those from other manufacturers.

In one embodiment, the reactor 302 includes a process chamber 310. The process chamber 310 is a high vacuum vessel that is coupled through a throttle valve 327 to a vacuum pump 336. The process chamber 310 includes a conductive chamber wall 330. The temperature of the chamber wall 330 is controlled using liquid-containing conduits (not shown) that are located in and/or around the wall 330. The chamber wall 330 is connected to an electrical ground 334. A liner 331 is disposed in the chamber 310 to cover the interior surfaces of the walls 330. The liner 331 facilitates in-situ self-cleaning capabilities of the chamber 310, so that byproducts and residues deposited on the liner 331 can be readily removed.

The process chamber 310 also includes a support pedestal 316 and a showerhead 332. The support pedestal 316 is disposed below the showerhead 332 in a spaced-apart relation. The support pedestal 316 may include an electrostatic chuck 326 for retaining a substrate 300 during processing. Power to the electrostatic chuck 326 is controlled by a DC power supply 320.

The support pedestal 316 may be coupled to a radio frequency (RF) bias power source 322 through a matching network 324. The bias power source 322 is generally capable of producing a bias power of about 0 to 3,000 Watts. Optionally, the bias power source 322 may be a DC or pulsed DC source.

The temperature of the substrate 300 supported on the support pedestal 316 is at least partially controlled by regulating the temperature of the support pedestal 316. In one embodiment, the support pedestal 316 includes a channels formed therein for flowing a coolant. In addition, a backside gas, such as helium (He) gas, provided from a gas source 348, fits provided into channels disposed between the back side of the substrate 300 and grooves (not shown) formed in the surface of the electrostatic chuck 326. The backside He gas provides efficient heat transfer between the pedestal 316 and the substrate 300. The electrostatic chuck 326 may also include a resistive heater (not shown) within the chuck body to heat the chuck 326 during processing.

The showerhead 332 is mounted to a lid 313 of the process chamber 310. A gas panel 338 is fluidly coupled to a plenum (not shown) defined between the showerhead 332 and the lid 313. The showerhead 332 includes a plurality of holes to allow gases provided to the plenum from the gas panel 338 to enter the process chamber 310.

The showerhead 332 and/or an upper electrode 328 positioned proximate thereto is coupled to an RF source power 318 through an impedance transformer 319 (e.g., a quarter wavelength matching stub). The RF source power 318 is generally capable of producing a source power of about 0 to 5,000 Watts.

During substrate processing, gas pressure within the interior of the chamber 310 is controlled using the gas panel 338 and the throttle valve 327. In one embodiment, the gas pressure within the interior of the chamber 310 is maintained at about 0.1 to 999 mTorr. The substrate 300 may be maintained at a temperature of between about 10 to about 500 degrees Celsius.

A controller 340, including a central processing unit (CPU) 344, a memory 342, and support circuits 346, is coupled to the various components of the reactor 302 to facilitate control of the processes of the embodiments described herein. The memory 342 can be any computer-readable medium, such as random access memory (RAM), read only memory (ROM), floppy disk, hard disk, or any other form of digital storage, local or remote to the reactor 302 or CPU 344. The support circuits 346 are coupled to the CPU 344 for supporting the CPU 344 in a conventional manner. These circuits include cache, power supplies, clock circuits, input/output circuitry and subsystems, and the like. A software routine or a series of program instructions stored in the memory 342, when executed by the CPU 344, causes the reactor 302 to perform an etch process of the embodiments described herein.

FIG. 3 only shows one exemplary configuration of various types of plasma reactors that can be used to practice the embodiments described herein. For example, different types of source power and bias power can be coupled into the plasma chamber using different coupling mechanisms. Using both the source power and the bias power allows independent control of a plasma density and a bias voltage of the substrate with respect to the plasma. In some applications, the plasma may be generated in a different chamber from the one in which the substrate is located, e.g., remote plasma source, and the plasma subsequently guided into the chamber using techniques known in the art.

While the foregoing is directed to embodiments of the invention, other and further embodiments of the invention may be devised without departing from the basic scope thereof.

What is claimed is:

1. A method for etching a magnetic material, comprising:
   providing a substrate having one or more layers of magnetic material deposited thereon;
   forming a patterned mask on the one or more layers of magnetic material; and
   etching the one or more layers of magnetic material using an oxidizer-free gas mixture comprising a hydrogen containing gas to remove at least a portion of the one or more layers of magnetic material, wherein the oxidizer-free gas mixture is a halogen-free gas mixture and the hydrogen containing gas is selected from the group consisting of: hydrogen ($H_2$), methane ($CH_4$), acetylene ($C_2H_4$), silane ($SiH_4$), hydrogen sulfide ($H_2S$), and combinations thereof.

2. The method of claim 1, wherein the oxidizer-free gas mixture further comprises a dilution gas.

3. The method of claim 2, wherein the dilution gas is selected from the group consisting of: helium (He), xenon (Xe), argon (Ar), nitrogen ($N_2$), and combinations thereof.

4. The method of claim 1, wherein the magnetic material is selected from at least one of CoFe, NiFe, MgO, $Al_2O_3$, Ru, IrMn, and PtMn.

5. The method of claim 1, wherein the one or more layers of magnetic material is part of a magneto-resistive random access memory (MRAM) stack.

6. The method of claim 1, wherein a temperature of the one or more layers of magnetic material is from about 20 degrees Celsius to about 300 degrees Celsius during the etching the one or more layers of magnetic material.

7. The method of claim 6, wherein the temperature is from about 200 degrees Celsius to about 250 degrees Celsius.

8. The method of claim 7, wherein a bias of less than 1,000 DC volts is applied to the one or more layers of magnetic material during the etching the one or more layers of magnetic material.

9. The method of claim 1, further comprising energizing the oxidizer-free gas mixture to a plasma.

10. A method of fabricating a magneto-resistive random access memory (MRAM) device from a film stack comprising a top electrode layer, a free magnetic layer, a tunnel layer, a magnetic film stack, a bottom electrode layer, and a barrier layer formed on a semiconductor substrate, comprising:
    forming a patterned mask on the film stack to define the device;
    etching the top electrode layer; and
    etching the magnetic film stack using an oxidizer-free gas mixture comprising a hydrogen containing gas to remove at least a portion of the magnetic film stack, wherein the oxidizer-free gas mixture is a halogen-free gas mixture and the hydrogen containing gas is selected from the group consisting of: hydrogen ($H_2$), methane ($CH_4$), acetylene ($C_2H_4$), silane ($SiH_4$), hydrogen sulfide ($H_2S$), and combinations thereof.

11. The method of claim 10, wherein the oxidizer-free gas mixture further comprises a dilution gas.

12. The method of claim 11, wherein the dilution gas is selected from the group consisting of: helium (He), xenon (Xe), argon (Ar), nitrogen ($N_2$), and combinations thereof.

13. The method of claim 10, wherein:
    the top electrode comprises at least one of tungsten (W), titanium nitride (TiN), titanium (Ti), tantalum (Ta), and tantalum nitride (TaN);
    the free magnetic layer comprises at least one of CoFe and NiFe;
    the tunnel layer comprises at least one of $Al_2O_3$ and MgO;
    the magnetic film stack comprises at least one of NiFe, Ru, CoFe, PtMn, and IrMn;
    the bottom electrode comprises at least one of tungsten (W), titanium nitride (TiN), titanium (Ti), tantalum (Ta), and tantalum nitride (TaN); and
    the barrier layer comprises at least one of $SiO_2$ and $Si_3N_4$.

14. The method of claim 10, wherein a temperature of the magnetic film stack is from about 20 degrees Celsius to about 300 degrees Celsius during the etching the magnetic film stack.

15. The method of claim 14, wherein the temperature is from about 200 degrees Celsius to about 250 degrees Celsius.

16. The method of claim 15, wherein a bias of less than 1,000 DC volts is applied to the magnetic film stack during the etching the magnetic film stack.

\* \* \* \* \*